United States Patent [19]

Cornish

[11] 4,327,343
[45] Apr. 27, 1982

[54] WIDEBAND MESFET MICROWAVE FREQUENCY DIVIDER

[75] Inventor: William D. Cornish, Ottawa, Canada

[73] Assignee: Her Majesty the Queen in right of Canada, as represented by the Minister of National Defence, Ottawa, Canada

[21] Appl. No.: 158,594

[22] Filed: Jun. 10, 1980

[30] Foreign Application Priority Data

Aug. 28, 1979 [CA] Canada .................................. 334577

[51] Int. Cl.³ .................... H01P 1/20; H03H 11/04
[52] U.S. Cl. ................................. 333/218; 307/225 C
[58] Field of Search ..................... 333/218; 363/163; 307/320; 328/16

[56] References Cited

U.S. PATENT DOCUMENTS 3,921,056 11/1975 Mahoney ............................ 333/218
4,152,680 5/1979 Harrison ............................. 333/218
4,176,332 11/1979 Backert ............................... 333/218

OTHER PUBLICATIONS

Beneking et al. *Procedure for the Measurement of s-parameters, etc.*, Proc. of 3rd Biennial Cornell E.E. Conference., Ithaca, NY Aug. 71 pp. 427–436.

Wolf, *Microwave Properties of Schottky—barrier Field—effect Transistors*, IBM J. Res. Develop.; Mar. 1970.

*Primary Examiner*—Paul L. Gensler
*Attorney, Agent, or Firm*—Larson and Taylor

[57] ABSTRACT

A frequency divider is known which uses varactor diodes in a circuit which resonates at $f_o/N$ where N is an even integer. Because of circuit losses within the varactor diodes, amplifiers are generally required to recover the input signal level. For systems that require cascaded frequency dividers at least one amplifier is required for each frequency divider. The present invention overcomes these problems by providing a microwave frequency divider to perform parametric frequency division and amplification simultaneously at microwave frequencies. A signal $f_o$ is applied to an input transmission line which forms, with the inherent frequency dependent non-linear gate-to-source capacitance of at least one MESFET, a circuit resonant at $f_o/N$, wherein N is an even integer such as 2. The source-drain path of the MESFET is coupled via an output transmission line to a balun transformer having an output to provide amplified signals at $f_o/N$. The transmission lines may be microstrip, stripline or other suitable type of transmission line.

10 Claims, 9 Drawing Figures

WIDEBAND MESFET MICROWAVE FREQUENCY DIVIDER

This invention relates to a microwave frequency divider and in particular an analog microwave frequency divider.

It is frequently desirable to down-convert microwave signals to a lower frequency. For example, after down-conversion, digital techniques can be adopted for measuring the frequencies of the down-converted signal and, knowing the factor by which the original signal was divided, it is easy to determine the original frequency of the microwave signals.

A presently well-established technique for down-conversion of microwave signals uses heterodyne conversion which relies on mixing a signal from a local oscillator with the microwave input signal. During heterodyne conversion, the absolute bandwidth remains unchanged and the fractional bandwidth increases. For instance, an input band of $(f_2 - f_1)$ with centre $f_0$ will retain a bandwidth of $(f_2 - f_1)$ even though the centre frequency has been reduced by the factor N to $f_0/N$. For a system producing a reduction by a factor "N", the heterodyning technique requires N times the fractional bandwidth at the output compared with the input. This limits the ultimate instantaneous bandwidth that can be down-converted using this method. In addition, any frequency aberrations of the local oscillator such as tuning time and post-tuning drift show up at the output.

Recently, a broadband frequency divider using microwave varactors has allowed down-conversion by a division-by-two process. Such a frequency divider is disclosed and claimed in Canadian Pat. No. 1,041,614 issued Oct. 31, 1978 in the name of Her Majesty the Queen in Right of Canada as represented by the Minister of National Defence and corresponding to U.S. Pat. No. 4,152,680 (Harrison). Such dividers rely on the generation of a sub-harmonic at one half the input frequency. Unlike the heterodyning technique, the varactor divide-by-two system reduces the absolute bandwidth in the division process such that the fractional bandwidth remains the same. This overcomes the bandwidth restraint inherent in the heterodyning technique. However, because of circuit losses within the varactor dividers, amplifiers are generally required to recover the input signal level. For systems that require cascaded frequency dividers, at least one amplifier is required for each frequency divider.

The present invention provides a microwave frequency divider which eliminates the need for separate amplifiers. The invention employs MESFET (metal semiconductor field effect transistor) devices to perform parametric frequency division and amplification simultaneously at microwave frequency.

Thus, in accordance with one aspect of the invention, there is provided a microwave frequency divider comprising at least one MESFET (metal semiconductor field effect transistor) having a gate, a source and a drain, a first transmission line connected to said gate and source and to input terminal means, said transmission line forming, with inherent frequency dependent non-linear capacitance between said gate and source, a resonant circuit at $f_0/N$, where $f_0$ is the frequency to be applied to said input terminal means, a second transmission line being connected to said source and drain and to output terminal means, whereby said MESFET simultaneously provides parametric frequency division and amplification at microwave frequencies.

According to another aspect of the invention, there is provided a microwave frequency divider comprising a first and a second MESFET (metal semiconductor field effect transistor), each having a source electrode, a drain electrode and a gate electrode, the gate of said first MESFET being connected via a first transmission line to an input terminal and the gate of said second MESFET being connected via a second transmission line to said input terminal, said source electrodes being connected to ground, said drain electrodes being connected via third and fourth transmission lines to a balun transformer having output connection means, said first and second transmission lines being of equal length and forming, with inherent gate-to-source frequency dependant non-linear capacitances of the MESFETs, a circuit resonant at $f_0/N$, where $f_0$ is the frequency to be applied to said input terminal and N is an even integer, said MESFETs simultaneously providing parametric frequency division and amplification at microwave frequencies.

The invention will now be further described in conjunction with the accompanying drawings, in which.

Figure 2:
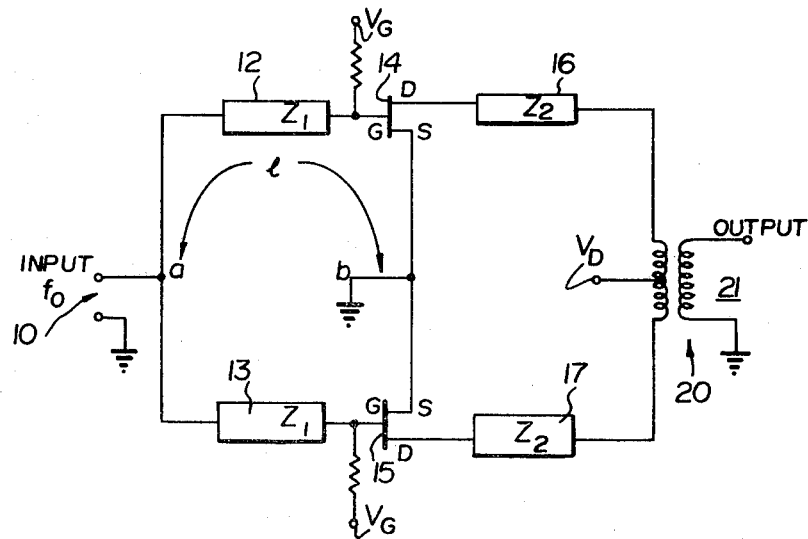
Figure 3A:
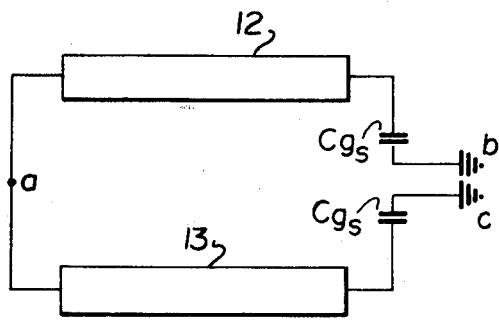
Figure 3B:
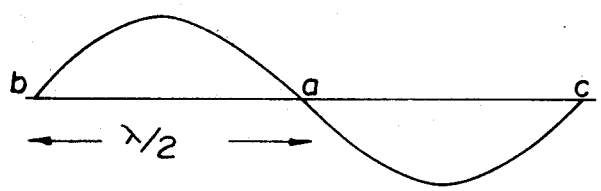
Figure 5:
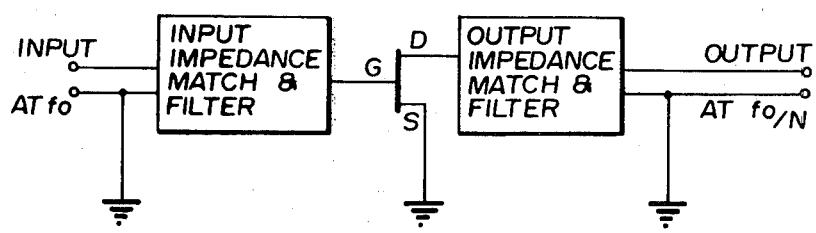
Figure 4:
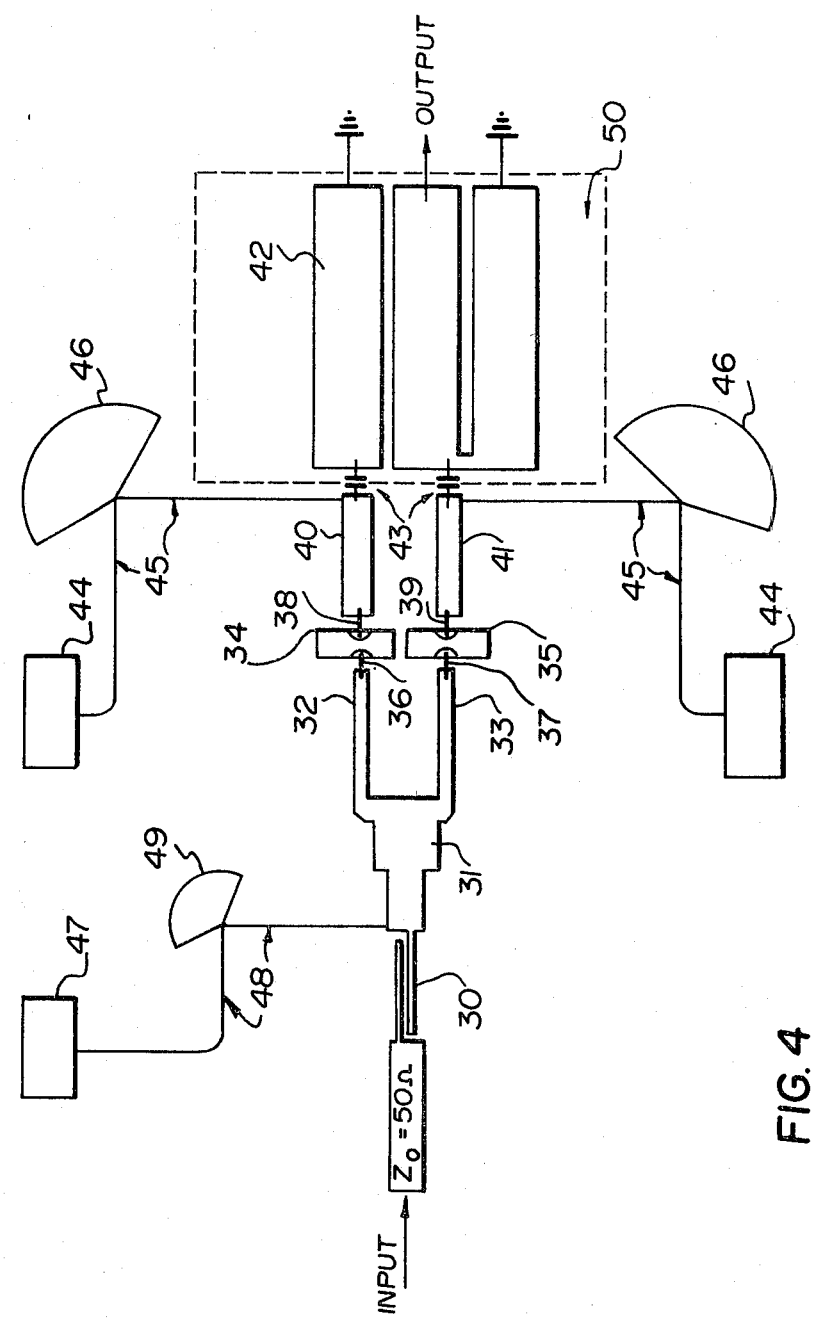
Figure 6A:
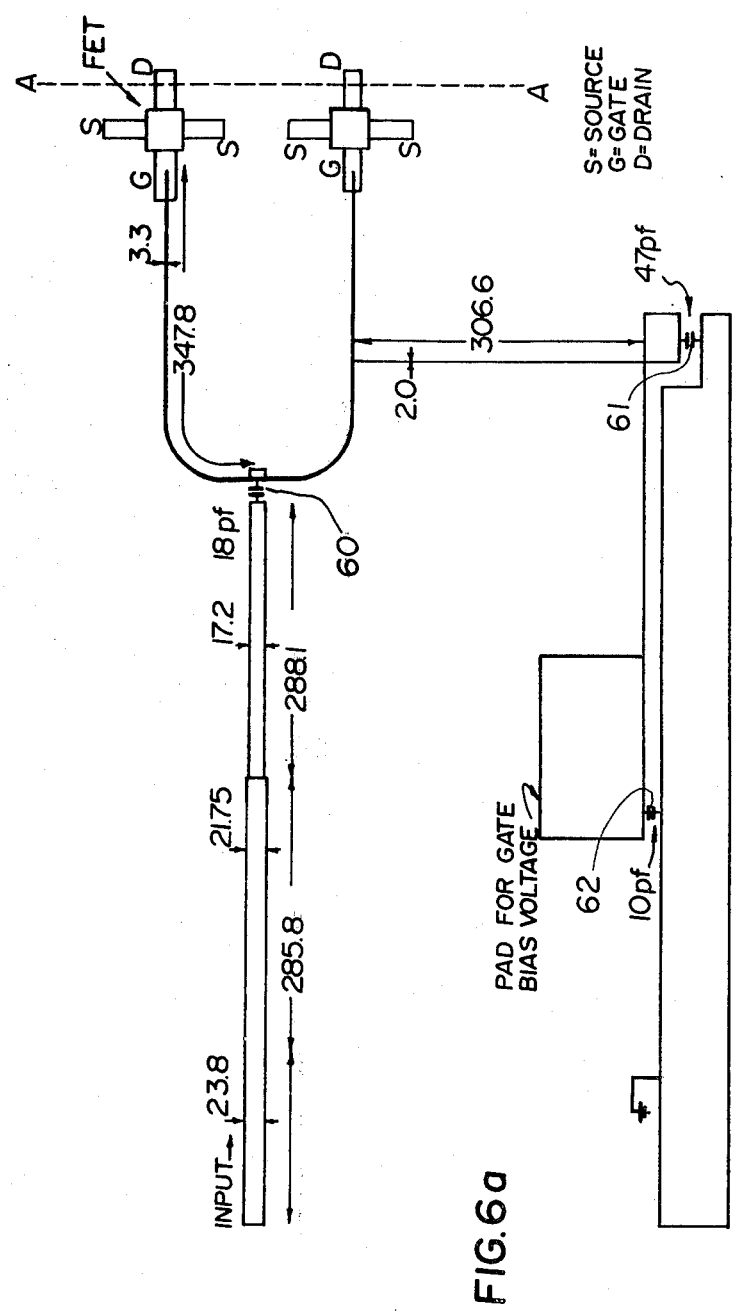
Figure 6B:
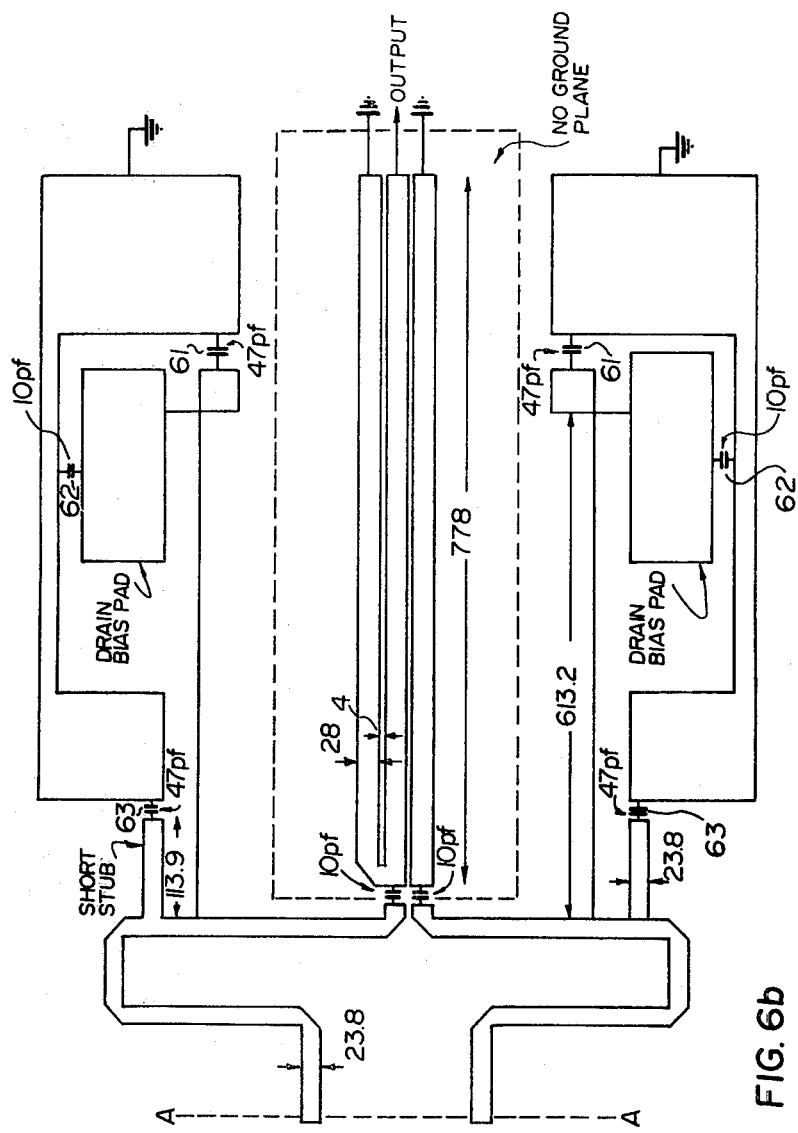

FIG. 2 is a simplified diagram of a MESFET frequency divider using a balanced circuit, FIG. 3(a) is a diagram illustrating the input resonant circuit, FIG. 3(b) illustrates the relative wave structure at the output frequency $f_0/N$, FIG. 4 is a diagram of a microstrip implementation of a MESFET frequency divider according to the invention, FIG. 5 is a simplified diagram of a frequency divider using a single MESFET, and FIGS. 6a and 6b (which join at line A—A) show the physical layout of an experimental divider.

Reference should be had to the aforementioned Canadian Pat. No. 1,041,614 for explanations of the structure and theory of operation of frequency dividers using microwave varactors. The principle of operation of the present invention is similar but replaces the varactors with the frequency dependent non-linear variable capacitance existing between the gate and source of a MESFET. The MESFET provides the additional advantage of not only enabling resonance of the input circuit to occur at $f_0/N$ but simultaneously provides an amplification function.

Figure 1A:
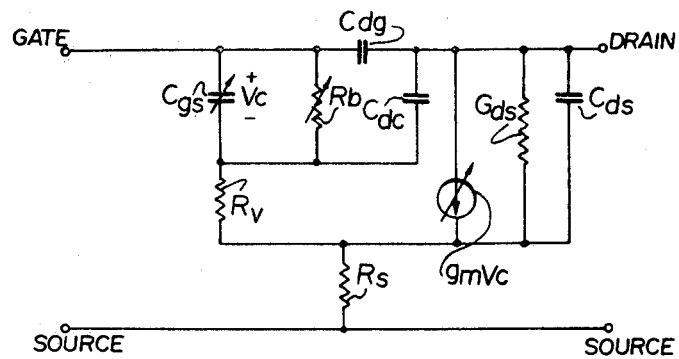
FIG. 1(a) is an equivalent circuit diagram of a MESFET.
Figure 1B:
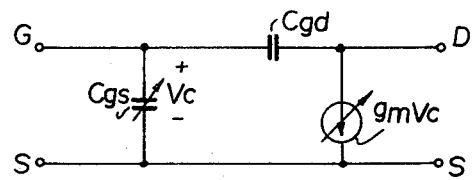
FIG. 1(b) is a simplified intrinsic circuit of a MESFET.

The principle of operation of the device according to the invention is based on the simplified equivalent circuit of FIGS. 1(a) and (b). In order that subharmonics can be generated, a frequency dependent non-linear capacitance must be present. This is found in $C_{gs}$, the gate-to-source non-linear capacitance caused by the Schottky barrier between the gate and the source of the MESFET. The $C_{gs}$ non-linearity has the characteristics of a Schottky-barrier varactor diode. These diodes have been used as multipliers, and diodes with similar characteristics, abrupt junction varactor diodes, have been used as dividers. When a signal is applied between the gate and the source, the MESFET may be envisioned as operating in two sections. The Schottky barrier diode containing $C_{gs}$ functions as a varactor divider producing subharmonics and the device transconductance, $g_m$, simultaneously provides amplification at the fundamental as well as the subharmonic frequencies.

The other elements shown in FIGS. 1(a) and (b) will be understood by those skilled in the art and it is not proposed to deal with these Figures in further detail.

FIG. 2 shows an equivalent circuit of a microwave frequency divider having a balanced configuration. Using a balanced configuration aids in filtering out the feed through of the fundamental as well as even harmonics. This is useful in octave band divide-by-2 devices because the input and output bands have a common frequency which makes normal filtering impossible. The operation of the divider shown in FIG. 2 will be described in terms of a divide-by-2 device; however the basic idea is applicable to higher order division, such as divide-by-4 and divide-by-8, as well.

The input signal at a frequency $f_0$ is applied to input terminals 10 and, via first and second transmission lines 12 and 13, to the gates G of two MESFETs 14 and 15. Lines 12 and 13 are designed so that distance "1" from point "a" to "b" provides a resonant circuit at $f_0/2$, where $f_0$ is the input frequency. This causes the divided signals to be out of phase, as may be seen from FIG. 3 which, in part (a), shows the input resonant circuit and, in part (b), the wave structure at the output frequency $f_0/2$. That is, the divided signals are out of phase through each of the MESFETs while the input signal is in phase. Simultaneously with the non-linear capacitance frequency conversion at the Schottky-barriers between the gate and source of each MESFET, drain current amplification occurs via the MESFET transconductance producing a frequency divided signal with increased amplitude at the source terminals of the MESFETs. First and second output impedance matching lines 16 and 17 (at $f_0/2$) connect the drains of the MESFETs 14 and 15 to a balun (balanced-to-unbalanced) transformer generally indicated at 20. The balun 20 allows the output 21 to be connected to a coaxial line. At the input 10, a simple "T" connection (at "a") is suitable, for although the input at $f_0$ is unbalanced, the resonant lines 12 and 13 provide a balanced circuit at $f_0/2$. DC biasing of the MESFETs 14 and 15 is accomplished through lines which are decoupled at microwave frequencies. The S or lumped-parameters of the MESFETS can be used to compute bias conditions that will prevent oscillation.

In FIG. 2, $Z_1$ represents the impedances of the input transmission lines, $Z_2$ represents the drain matching impedances, $V_D$ is the dc drain voltage and $V_G$ is the dc gate voltage.

FIG. 4 shows a microstrip version of a balanced MESFET divider. The input at frequency $f_0$ passes through a dc blocking capacitor 30 which in this case also acts as a band pass filter at frequency $f_0$. A simple chip capacitor could also be used. Line 31 provides impedance matching at $f_0$. Lines 32 and 33 are designed to be resonant at $f_0/N$, where $f_0/N$ is the subharmonic of interest. Two MESFETs 34 and 35 are connected to lines 32 and 33 via their gates 36 and 37. The source terminals, not shown, are grounded. The drain terminals 38 and 39 are connected to lines 40 and 41 which provide impedance matching at $f_0/N$. Lines 40 and 41 are connected to the balun 42 through dc blocking capacitors 43. These blocking capacitors 43 could take the same form as capacitor 30. The drain voltage is applied to each MESFET through pads 44 which are connected to lines 40 and 41 through high impedance ¼ λ lines 45. The pie-shaped structures 46 are broadband short circuits tuned for the output frequency band. The gate voltage is applied through pad 47, ¼ λ lines 48 and the broadband short circuit 49 tuned to the input frequency band.

For dividers of higher order than 2, such as divide-by-4 and divide-by-8, a balanced circuit is not required for filtering since there is no overlap between the input and output bands. It may however improve the bandwidth and still be desirable. In this case, a circuit with one MESFET could be used as shown in the equivalent circuit of FIG. 5. FIG. 5 is believed to be self-explanatory in view of the foregoing description and it is not proposed to discuss it further.

Referring to FIG. 4 again there is no ground plane in the area 50 indicated by dashed lines, whereas there is a ground plane beneath the remaining circuitry because, as mentioned above, this is a microstrip configuration.

In addition to constructing the MESFET divider in microstrip, other configurations such as stripline, wave guide, co-planar wave guide, slotline and coaxial waveguide could be used.

The microwave frequency divider according to the present invention uses a MESFET device to simultaneously frequency divide and amplify microwave signals for use where both broad bandwidths and fast pulse response are required. Previously varactor diodes have been used to do this but they have typically 10 dB loss associated with the frequency conversion.

FIG. 6a and FIG. 6b (which join at line A—A) show the physical layout of an experimental divider which was designed to work over a narrow frequency band in order to verify the ability of MESFETS to generate subharmonics. All dimensions in FIGS. 6a and 6b are in thousandths of an inch. The MESFETS used were Dexcel model DXL 3501A-P70. As can be seen, the layout shown in FIGS. 6a and 6b is in essence the same as FIG. 4. In place of lines 30, a lumped element blocking capacitor 60 has been used. In place of the broadband short circuits 46 and 49, capacitors 61 shorted to ground have been used and their values are as indicated. The capacitors 62 between the Drain Bias Pads and ground and between the Gate Bias Pad and ground are to aid in the suppression of low frequency oscillations that may result in the bias lines and adversely affect the operation of the device. The short stubs in FIG. 6b, shorted to ground with a capacitor 63 provide some impedance matching at the output frequency. Input and output impedance matching was accomplished using the device S-parameters supplied by the manufacturer.

With this configuration signals between 3.545 GHz and 3.808 GHz were subharmonically divided by 2. The following results were obtained at an input frequency of 3.773 GHz:

Gate Bias Voltage: −1.69 V Drain Bias Voltage: 3.01 V

Input power at $f_{in}$: 6 dBm

Output power at $f_{in}/2$: 7.4 dBm

Feed through rejection of $f_{in}$: 31 dB below $f_{in}/2$

Minimum power for turn on: 3.9 dBm

The embodiments of the invention in which an exclusive property or privilege is claimed are defined as follows:

1. A microwave frequency divider comprising at least one MESFET (metal semiconductor field effect transistor) having a gate, a source and a drain, a first transmission line connected to said gate and source and to input terminal means, said transmission line forming, with the inherent frequency dependent non-linear capacitance between said gate and source, a resonant circuit the length of said transmission line being such that said resonant circuit resonates at the subharmonic frequency $f_0/N$, where $f_0$ is the frequency to be applied to said input terminal means, said resonant circuit acting to sustain said subharmonic frequency, a second transmission line being connected to said source and drain and to output terminal means, whereby said MESFET simultaneously provides parametric frequency division and amplification at microwave frequencies.

2. A microwave frequency divider as claimed in claim 1 wherein N is 2.

3. A microwave frequency divider comprising a first and a second MESFET (metal semiconductor field effect transistor), each having a source electrode, a drain electrode and a gate electrode, the gate of said first MESFET being connected via a first transmission line to an input terminal and the gate of said second MESFET being connected via a second transmission line to said input terminal, said source electrodes being connected to ground, said drain electrodes being connected via third and fourth transmission lines to a balun transformer having output connection means, said first and second transmission lines being of equal length and forming, with inherent gate-to-source frequency dependent non-linear capacitances of the MESFET's, a circuit resonant at the subharmonic frequency $f_0/N$, where $f_0$ is the frequency to be applied to said input terminal and N is an even integer, said resonant circuit acting to sustain said subharmonic frequency, said MESFET's simultaneously providing parametric frequency division and amplification at microwave frequencies.

4. A microwave frequency divider as claimed in claim 3 wherein N is 2.

5. A microwave frequency divider as claimed in claim 4 wherein said transmission lines are microstrip lines.

6. A microwave frequency divider as claimed in claim 5 wherein a dc blocking capacitor is connected between said input terminal and said first and second transmission lines.

7. A microwave frequency divider as claimed in claim 6 wherein said third and fourth transmission lines provide impedance matching at $f_0/2$.

8. A microwave frequency divider as claimed in claim 7 wherein said third and fourth transmission lines are connected to said balun transformer via dc blocking capacitors.

9. A microwave frequency divider as claimed in claim 8 wherein high impedance means are provided for applying bias voltage to said drains.

10. A microwave frequency divider as claimed in claim 9 wherein high impedance means are provided for applying bias voltage to said gates.

\* \* \* \* \*